United States Patent
Chung et al.

(10) Patent No.: US 8,111,520 B2
(45) Date of Patent: Feb. 7, 2012

(54) SEMICONDUCTOR MODULE

(75) Inventors: Hyun-Soo Chung, Hwaseong-si (KR);
Dong-Ho Lee, Seongnam-si (KR);
Dong-Han Kim, Osan-si (KR);
Seong-Deok Hwang, Seoul (KR);
Ki-Hyuk Kim, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 473 days.

(21) Appl. No.: 12/344,817

(22) Filed: Dec. 29, 2008

(65) Prior Publication Data
US 2009/0168382 A1    Jul. 2, 2009

(30) Foreign Application Priority Data
Jan. 2, 2008   (KR) .................. 10-2008-0000143

(51) Int. Cl.
*H05K 1/18*   (2006.01)

(52) U.S. Cl. ................................................ 361/763
(58) Field of Classification Search .......... 361/761–764; 257/686, 777
See application file for complete search history.

(56) References Cited

U.S. PATENT DOCUMENTS 3,777,221 A * 12/1973 Tatusko et al. ................ 361/761

FOREIGN PATENT DOCUMENTS

| JP | 11-312778 | 11/1999 |
| KR | 10-0281133 | 11/2000 |
| KR | 10-0703816 | 3/2007 |

* cited by examiner

*Primary Examiner* — Khiem Nguyen
(74) *Attorney, Agent, or Firm* — Stanzione & Kim, LLP

(57) ABSTRACT

A semiconductor module can include a printed circuit board (PCB) and a semiconductor package inserted into an inner space of the PCB. The semiconductor package may be electrically connected to the PCB. The PCB may thus surround the semiconductor package so that cracks may not be generated in the outer terminals.

4 Claims, 6 Drawing Sheets

SEMICONDUCTOR MODULE

CROSS-REFERENCE TO RELATED APPLICATIONS

This application claims priority under 35 USC §119 to Korean Patent Application No. 2008-0000143, filed on Jan. 2, 2008 in the Korean Intellectual Property Office (KIPO), the contents of which are herein incorporated by reference in their entirety.

BACKGROUND

1. Field of the Invention

Example embodiments relate to a semiconductor module and a method of manufacturing the same. More particularly, example embodiments relate to a semiconductor module including a semiconductor package, and a method of manufacturing the semiconductor module.

2. Description of the Related Art

Generally, a plurality of semiconductor fabrication processes may be performed on a semiconductor substrate to form a plurality of semiconductor chips. In order to mount the semiconductor chip on a printed circuit board (PCB), a packaging process may be performed on the semiconductor chip to form a semiconductor package. Here, the semiconductor package may include outer terminals such as solder balls. The outer terminals may be mounted on electrode patterns of the PCB to form a semiconductor module.

When the semiconductor module is operated, the semiconductor module may thermally expand. Here, a thermal expansion coefficient difference between the semiconductor package and the PCB may be very large. Thus, cracks may be generated in the outer terminals, so that an electrical connection between the semiconductor package and the PCB may be disconnected.

Further, after mounting the semiconductor package on the PCB, it may be required to perform a molding process for molding the outer terminals with a molding member to protect the outer terminals from external impacts. Furthermore, when defects may be generated in the outer terminals, it may be very difficult to repair or exchange the defective outer terminals due to the molding member.

Moreover, because the semiconductor package may be arranged on the PCB, the semiconductor module may have a very thick thickness.

SUMMARY

Example embodiments provide a semiconductor module that may have improved electrical connection between a semiconductor package and a PCB and a very thin thickness without using of a molding member.

Additional embodiments of the present general inventive concept will be set forth in part in the description which follows and, in part, will be obvious from the description, or may be learned by practice of the general inventive concept.

Example embodiments also provide a method of manufacturing the above-mentioned semiconductor module.

According to some example embodiments, there is provided a semiconductor module. The semiconductor module may include a printed circuit board (PCB) and a semiconductor package. The PCB may have an inner space. The semiconductor package may be received in the inner space. The semiconductor package may be electrically connected to the PCB.

In an example embodiment, the semiconductor module may further include an electrode pattern formed on a surface of the PCB. The electrode pattern may be electrically connected to the semiconductor package. Further, the semiconductor module may further include an insulating layer pattern formed on the surface of the PCB. The insulating layer pattern may have an opening configured to partially expose the electrode pattern. The opening may be in fluidic communication with the inner space.

In an example embodiment, the semiconductor module may further include an outer terminal formed on the surface of the PCB to cover the inner space. The outer terminal may be electrically connected between the PCB and the semiconductor package. Further, the semiconductor module may further include a dummy outer terminal formed on the surface of the PCB. The dummy outer terminals may be electrically connected to the PCB.

In an example embodiment, the semiconductor package may include a semiconductor chip, a first insulating layer pattern, a conductive layer pattern and a second insulating layer pattern. The semiconductor chip may include a bonding pad. The first insulating layer pattern may be formed on the semiconductor chip. Further, the first insulating layer pattern may be configured to expose the bonding pad. The conductive layer pattern may be formed on the first insulating layer pattern. The conductive layer pattern may have a first end electrically connected to the bonding pad. The second insulating layer pattern may be formed on the conductive layer pattern and the first insulating layer pattern. The second insulating layer pattern may be configured to expose a second end of the conductive layer pattern opposite to the first end. Here, the second end of the conductive layer pattern may be exposed through the inner space and electrically connected to the PCB.

According to some example embodiments, there is provided a semiconductor module. The semiconductor module may include a printed circuit board (PCB), a first semiconductor package, a second semiconductor package, a first electrode pattern, a second electrode pattern, a first insulating layer pattern, a second insulating layer pattern, a first outer terminal and a second outer terminal. The PCB may have a first surface and a second surface opposite to the first surface. Further, the PCB may have an inner space exposed through the first surface and the second surface. The first semiconductor package and the second semiconductor package may be received in the inner space. The first electrode pattern and the second electrode pattern may be formed on the first surface and the second surface of the PCB, respectively. The first insulating layer pattern and the second insulating layer pattern may be formed on the first surface and the second surface of the PCB, respectively. The first insulating layer pattern may have a first opening configured to partially expose the first electrode pattern. The second insulating layer pattern may have a second opening configured to partially expose the second electrode pattern. The first outer terminal may be formed on the first surface of the PCB to cover the inner space and the first opening. The first outer terminal may electrically connect the first semiconductor package to the first electrode pattern. The second outer terminal may be formed on the second surface of the PCB to cover the inner space and the second opening. The second outer terminal may electrically connect the second semiconductor package to the second electrode pattern.

In an example embodiment, the semiconductor module may further include a first dummy outer terminal formed on the first surface of the PCB and electrically connected to the first electrode pattern, and a second dummy outer terminal formed on the second surface of the PCB and electrically connected to the second electrode pattern.

According to some example embodiments, there is provided a method of manufacturing a semiconductor module. In the method of manufacturing the semiconductor module, an electrode pattern may be formed on a PCB having an inner space. A semiconductor package may be inserted into the inner space. The inner space may be formed on a surface of the PCB to cover the inner space with an outer terminal. The outer terminal may be electrically connected to the semiconductor package.

In an example embodiment, the method may further include forming an insulating layer pattern on the surface of the PCB. The insulating layer pattern may have an opening configured to partially expose the electrode pattern. The opening may be in fluidic communication with the inner space.

In an example embodiment, the method may further include forming a dummy outer terminal on the surface of the PCB. The dummy outer terminals may be electrically connected to the PCB.

According to some example embodiments, there is provided a method of manufacturing a semiconductor module. In the method of manufacturing the semiconductor module, a first electrode pattern may be formed on a first surface of a PCB having an inner space. A first insulating layer pattern may be formed on the first surface of the PCB. The first insulating layer pattern may have a first opening configured to partially expose the first electrode pattern and be in fluidic communication with the inner space. A second electrode pattern may be formed on a second of a PCB opposite to the first surface. A second insulating layer pattern may be formed on the second surface of the PCB. The second insulating layer pattern may have a second opening configured to partially expose the second electrode pattern and be in fluidic communication with the inner space. A first semiconductor package and a second semiconductor package may be inserted into the inner space. A first outer terminal may be formed on the first surface of the PCB to cover the inner space and the first opening. The first outer terminal may electrically connect the first semiconductor package to the first electrode pattern. A second outer terminal may be formed on the second surface of the PCB to cover the inner space and the second opening. The second outer terminal may electrically connect the second semiconductor package to the second electrode pattern.

In an example embodiment, the method may further include forming a first dummy outer terminal, which may be electrically connected to the first electrode pattern, on the first surface of the PCB first electrode pattern, and a second dummy outer terminal, which may be electrically connected to the second electrode pattern, formed on the second surface of the PCB.

According to some example embodiments, the semiconductor package may be received in the inner space of the PCB. Thus, the PCB may surround all of outer surfaces of the semiconductor package so that cracks may not be generated in the outer terminals. Further, because a molding member may be unnecessary, it may be very easy to repair or exchange the outer terminal. Furthermore, the semiconductor package may not cause a thickening of the semiconductor module, so that the semiconductor module may have a very thin thickness.

Another example embodiment provides a semiconductor module including a printed circuit board (PCB) having a first electrode formed on a surface thereof, a semiconductor package disposed within an inner space of the PCB, the semiconductor package having a bonding portion exposed through the surface to an outside of the PCB, and a first terminal to electrically connect the bonding portion to the first electrode.

In another example embodiment, the PCB can include a second electrode formed on the surface thereof. The semiconductor module can further include an insulating layer formed on the surface of the PCB, the insulating layer having a first opening to surround the exposed portion of the first electrode and a second opening to partially expose the second electrode through the insulating layer.

In still another example embodiment, the semiconductor module can include a second terminal electrically connected to the second electrode, and the first and second terminals can be formed on the semiconductor module to cover the first and second openings, respectively.

In still another example embodiment, a thickness of the semiconductor module can be substantially the same as a thickness of the PCB.

Another example embodiment provides a semiconductor module mounted to a motherboard.

BRIEF DESCRIPTION OF THE DRAWINGS

These and/or other embodiments of the present general inventive concept will become apparent and more readily appreciated from the following description of the example embodiments, taken in conjunction with the accompanying drawings of which.

DETAILED DESCRIPTION OF THE EMBODIMENTS

Figure 1:
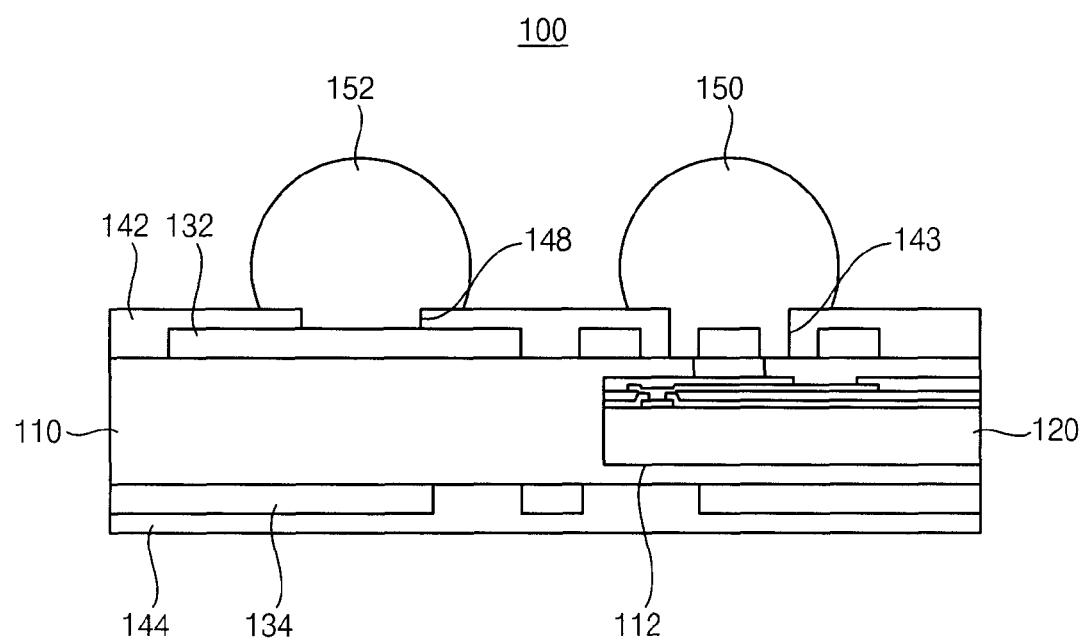
FIG. 1 is a cross-sectional view illustrating a semiconductor module in accordance with some example embodiments.

Reference will now be made in detail to the embodiments of the present general inventive concept, examples of which are illustrated in the accompanying drawings, wherein like reference numerals refer to the like elements throughout. The example embodiments are described below in order to explain the present general inventive concept by referring to the figures. Various example embodiments will be described more fully hereinafter with reference to the accompanying drawings. The present general inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are merely used to distinguish one element, component, region, layer or section from another region, layer or section. Thus, a first element, component, region, layer or section discussed below could be termed a second element, component, region, layer or section without departing from the broader teachings, principles, and spirit of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which the general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
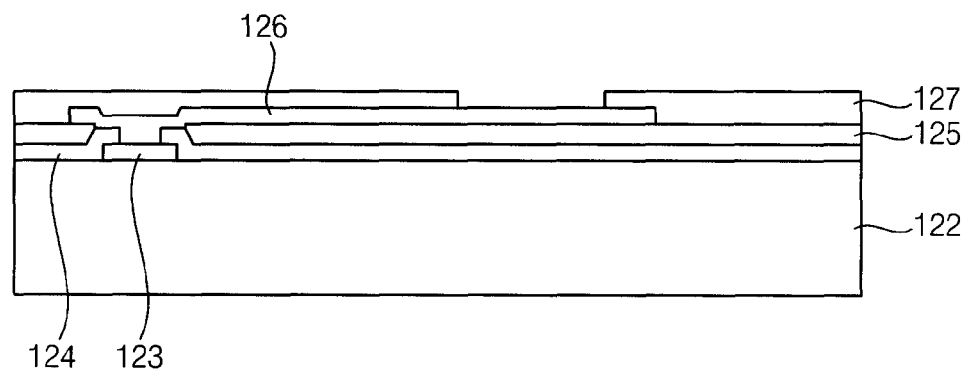
FIG. 2 is a cross-sectional view illustrating a semiconductor package of the semiconductor module of FIG. 1.

FIG. 1 is a cross-sectional view illustrating a semiconductor module in accordance with some example embodiments, and FIG. 2 is a cross-sectional view illustrating a semiconductor package of the semiconductor module in FIG. 1.

Referring to FIG. 1, a semiconductor module 100 of this example embodiment may correspond to a single surface mount type. The semiconductor module 100 may include a printed circuit board (PCB) 110, a semiconductor package 120, a first electrode pattern 132, a second electrode pattern 134, a first insulating layer pattern 142, a second insulating layer pattern 144 and outer terminal 150.

Figure 3:
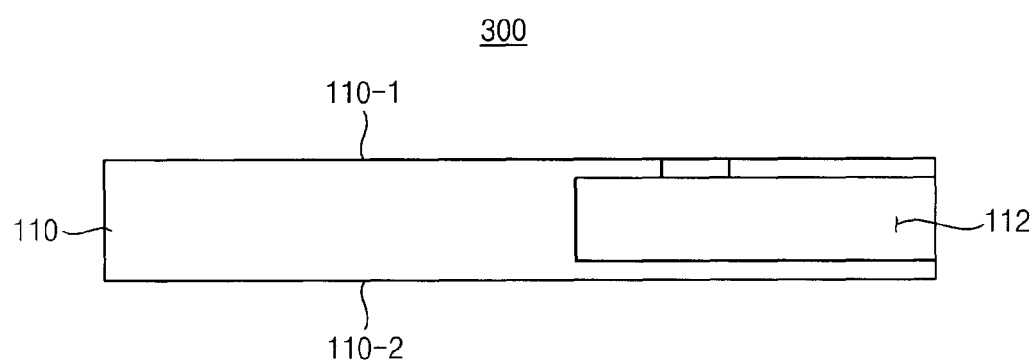
FIGS. 3 to 6 are cross-sectional views illustrating a method of manufacturing the semiconductor module of FIG. 1.

As illustrated in FIG. 3, the PCB 110 may have a first surface 110-1 and a second surface 110-2 opposite to the first surface. In this example embodiment, the first surface may correspond to an upper surface of the PCB 110. The second surface may correspond to a lower surface of the PCB 110. The PCB 110 may be mounted to a motherboard 300.

Referring to FIGS. 1 and 3, the PCB 110 may have an inner space 112. The inner space 112 may be exposed through the first surface. In this example embodiment, the inner space 112 may have a rectangular parallelepiped shape having a width greater than a height.

The semiconductor package 120 may be received in the inner space 112. Thus, the inner space 112 may have a size substantially the same as or slightly greater than that of the semiconductor package 120. The PCB 110 may surround an entire surface of the semiconductor package 120 by receiving the semiconductor package 120 in the inner space 112 of the PCB 110. Therefore, cracks, which may be caused by a thermal expansion coefficient difference between the PCB 110 and the semiconductor package 120, may not be generated in the outer terminal 150. Further, the semiconductor package 120 in the inner space 112 may not cause a thickening of the semiconductor module 100. That is, the semiconductor module 100 may have a thickness substantially the same as that of the PCB 110.

In this example embodiment, an example of the semiconductor package 120 may include a wafer level package. With reference to FIG. 2, the semiconductor package 120 may include a semiconductor chip 122, a passivation layer 124, a first insulating layer pattern 125, a conductive layer pattern 126 and a second insulating layer pattern 127. The semiconductor chip 122 may have a bonding pad 123. The passivation layer 124 may be formed on the semiconductor chip 122. The passivation layer 124 may be configured to expose the bonding pad 123 through the passivation layer 124. The first insulating layer pattern 125 may be formed on the passivation layer 124. The first insulating layer pattern 125 may be configured to expose the bonding pad 123 through the first insulating layer patter 125. The conductive layer pattern 126 may be formed on the first insulating layer pattern 125. The conductive layer pattern 126 may have a first end electrically connected to the bonding pad 123. The second insulating layer pattern 127 may be formed on the conductive layer pattern 126 and the first insulating layer pattern 125. The second insulating layer pattern 127 may be configured to expose a second end of the conductive layer pattern 126 through the second insulating layer pattern 127. The bonding pad 123 of the semiconductor package 120 in the inner space 112 may be arranged and oriented toward an upward direction. Thus, the bonding pad 123 may be exposed through the first surface of the PCB 110. Here, the semiconductor package 120 may include other packages such as a chip scale package, a package having a lead frame, a package having a conductive bump, etc., as well as the wafer level package.

Referring again to FIG. 1, the first electrode pattern 132 may be formed on the first surface of the PCB 110. The first electrode pattern 132 may include a first electrode on the first surface of the PCB 110, and a second electrode over the bonding pad 123. In this example embodiment, the first electrode pattern 132 may include a metal such as copper, aluminum, and the like.

The second electrode pattern 134 may be formed on the second surface of the PCB 110 opposite the first surface. The second electrode pattern 134 may include a third electrode on the second surface of the PCB 110, and a fourth electrode under the bonding pad 123. In this example embodiment, the second electrode pattern 134 may include a metal such as copper, aluminum, and the like.

The first insulating layer pattern 142 may be formed on the first surface of the PCB 110 to cover the first electrode pattern 132. The first insulating layer pattern 142 may have a first opening 143 configured to expose the second electrode of the first electrode pattern 132 through the first insulating layer pattern 142. Thus, the bonding pad 123 may be exposed through the inner space 112 and the first opening 143. In this example embodiment, the first insulating layer pattern 142 may include photosensitive resist (PSR).

The second insulating layer pattern 144 may be formed on the second surface of the PCB 110 to cover the second electrode pattern 134. In this example embodiment, the second insulating layer pattern 144 may include PSR.

The outer terminal 150 may be mounted on the first insulating layer pattern 142. The first opening 143 and the inner space 112 may be filled with the outer terminal 150. Therefore, the outer terminal 150 may electrically connect the bonding pad 123 of the semiconductor package 120 to the second electrode of the first electrode pattern 132. Here, because the PCB 110 may firmly support the semiconductor package 120 in the inner space 112, cracks may not be generated in the outer terminal 150. The outer terminal 150 may be mounted on a motherboard. In this example embodiment, the outer terminal 150 may include a solder ball.

Additionally, a dummy outer terminal 152 may be mounted on the first electrode of the first electrode pattern 132. In this example embodiment, the first insulating layer pattern 142 may have a second opening 148 configured to partially expose the first electrode of the first electrode pattern 132 through the first insulating layer pattern 142. Here, when an electrical connection between the outer terminal 150 and the bonding pad 123 may be disconnected due to a defect of the outer terminal 150, the dummy outer terminal 152 may be used in place of the outer terminal 150. Further, the dummy outer terminal 152 may function as to reinforce a mechanical strength of the semiconductor module mounted on the motherboard.

Further, various passive elements may be mounted on the first insulating layer pattern 142.

FIGS. 3 to 6 are cross-sectional views illustrating a method of manufacturing the semiconductor module of FIG. 1.

Referring to FIG. 3, the inner space 112 may be formed in the PCB 110. The inner space 112 may be exposed through the first surface 110-1 of the PCB 110.

Figure 4:
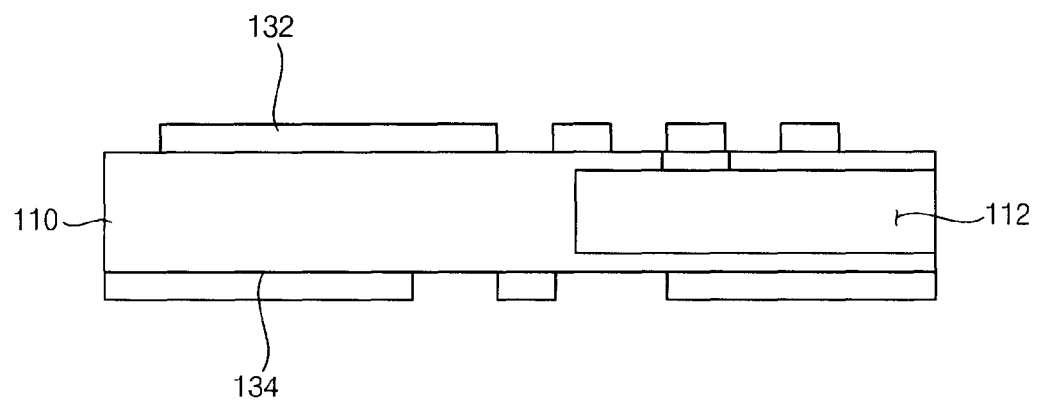

Referring to FIG. 4, the first electrode pattern 132 may be formed on the first surface 110-1 of the PCB 110. In this example embodiment, the second electrode of the first electrode pattern 132 may be located in an upper portion of the inner space 112. Particularly, a conductive layer (not shown) may be formed on the first surface of the PCB 110 by a sputtering process. A mask pattern (not shown) may be formed on the conductive layer. The conductive layer may be etched using the mask pattern as an etch mask to form the first electrode pattern 132.

The second electrode pattern 134 may be formed on the second surface 110-2 of the PCB 110. In this example embodiment, a conductive layer (not shown) may be formed on the second surface 110-2 of the PCB 110 by a sputtering process. A mask pattern (not shown) may be formed on the conductive layer. The conductive layer may be etched using the mask pattern as an etch mask to form the second electrode pattern 134.

Figure 5:
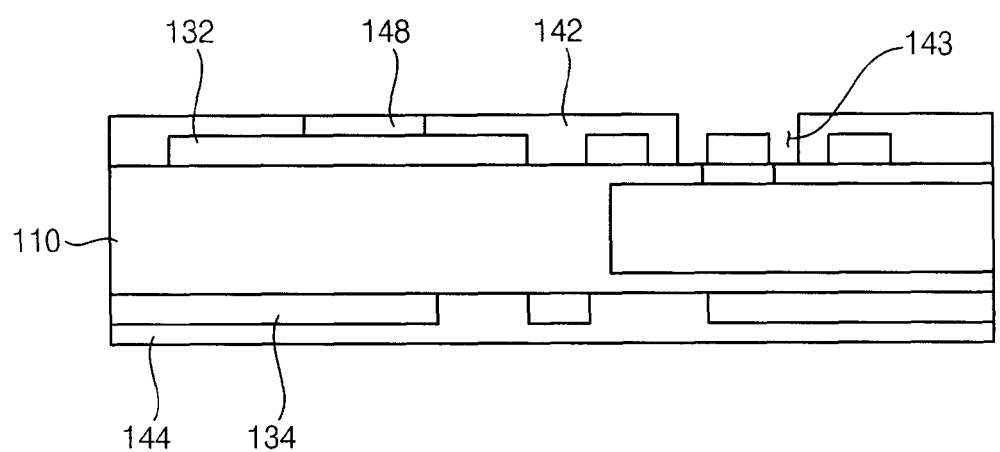

Referring to FIG. 5, the first insulating layer pattern 142 having the first opening 143 and the second opening 148 may be formed on the first surface of the PCB 110 and the first electrode pattern 132. Here, the first electrode of the first electrode pattern 132 may be exposed through the second opening 148 to an outside of the first insulating layer pattern 142. Further, the second electrode of the first electrode pattern 132 may be exposed through the first opening 143. Particularly, a first insulating layer (not shown) may be formed on the first surface of the PCB 110 to cover the first electrode pattern 132. A photoresist pattern (not shown) may be formed on the first insulating layer. The first insulating layer may be etched using the photoresist pattern as an etch mask to form the first insulating layer pattern 142 having the first opening 143 and the second opening 148.

The second electrode pattern 144 may then be formed on the second surface of the PCB 110 and the second electrode pattern 134.

Figure 6:
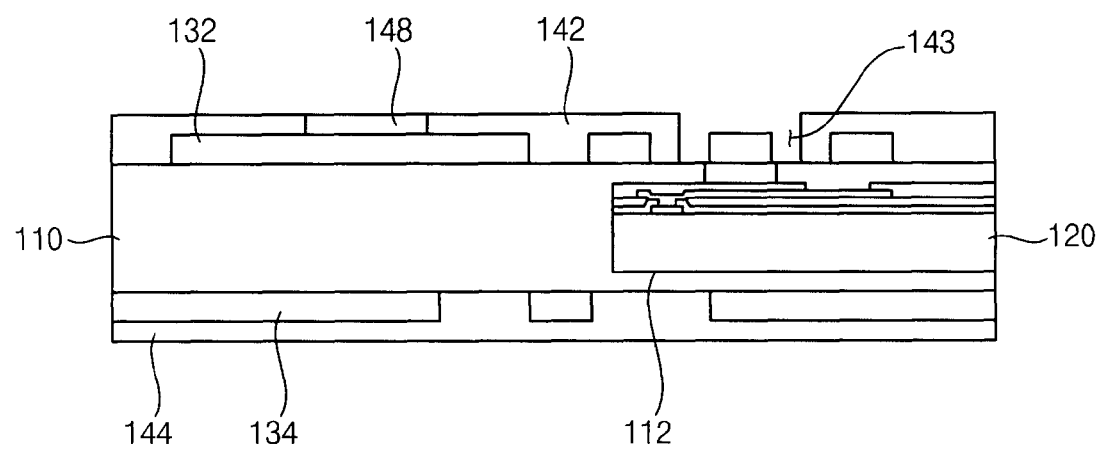

Referring to FIG. 6, the semiconductor package 120 may be inserted into the inner space 112. The bonding pad 123 of the semiconductor package 120 may be exposed through the inner space 112 and the first opening 143.

Referring again to FIG. 1, the outer terminal 150 may be mounted on the first insulating layer pattern 142 to cover or fill up the first opening 143 and the inner space 112. Thus, the second electrode of the first electrode pattern 132 may be electrically connected to the bonding pad 123 of the semiconductor package 120 via the outer terminal 150.

Additionally, the dummy outer terminal 152 may be mounted on the first insulating layer pattern 142 to cover the second opening 148. The dummy outer terminal 152 may be electrically connected to the first electrode of the first electrode pattern 132.

Further, the outer terminal 150 and the dummy outer terminal 152 may be firmly attached to the second electrode and the first electrode of the first electrode pattern 132, respectively, by a reflow process.

According to this example embodiment, the semiconductor package may be received in the inner space of the PCB. Thus, the PCB may surround all of outer surfaces of the semiconductor package so that cracks may not be generated in the outer terminals. Further, because a molding member may be unnecessary, it may be very easy to repair or exchange the outer terminal. Furthermore, the semiconductor package may not cause a thickening of the semiconductor module, so that the semiconductor module may have a very thin thickness.

Figure 7:
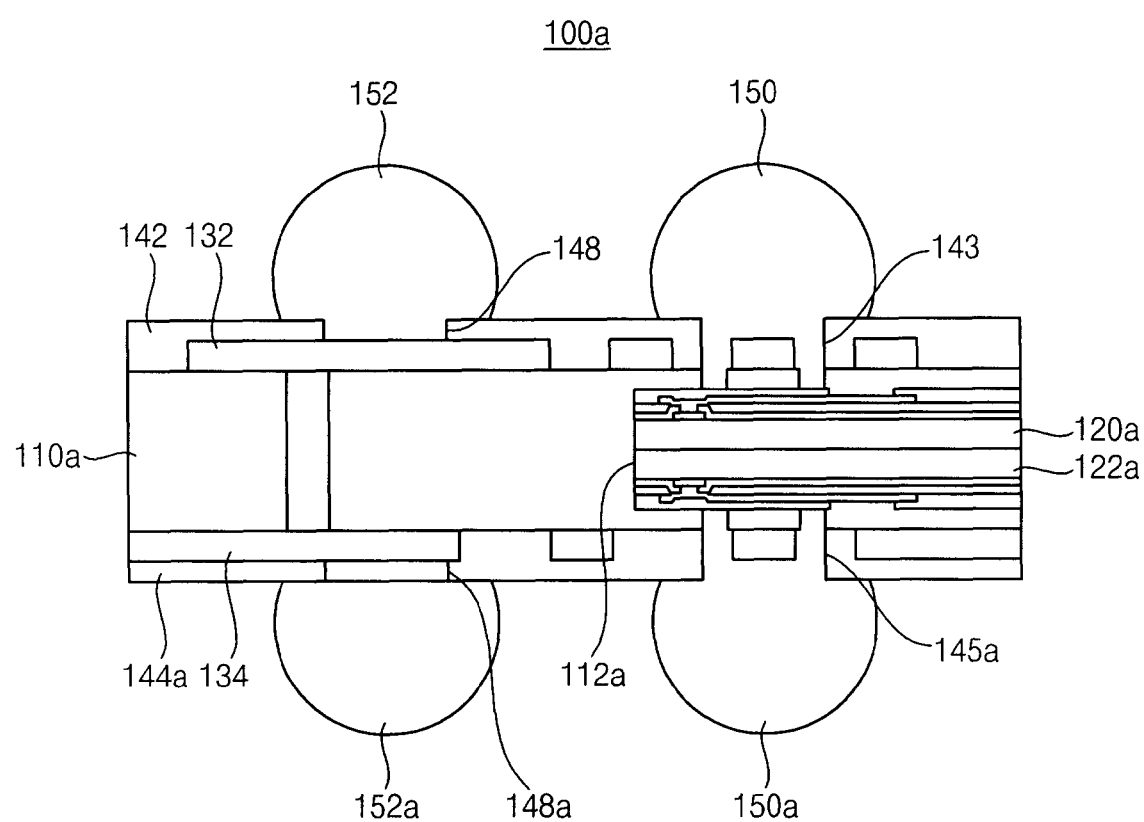
FIG. 7 is a cross-sectional view illustrating a semiconductor module in accordance with some example embodiments.

FIG. 7 is a cross-sectional view illustrating a semiconductor module in accordance with some example embodiments.

Referring to FIG. 7, the semiconductor module 100a of this example embodiment may correspond to a dual surface mount type. Thus, the same reference numerals refer to elements in the semiconductor module 100a of this example embodiment substantially the same as those in the semiconductor module 100 in FIG. 1. Further, any further illustrations with respect to the same elements are omitted herein for brevity.

The semiconductor module 100a may include the PCB 110a, a first semiconductor package 120a, a second semiconductor package 122a, the first electrode pattern 132, the second electrode pattern 134, the first insulating layer pattern 142, a second insulating layer pattern 144a, a first outer terminal 150 and a second outer terminal 150a.

Figure 8:
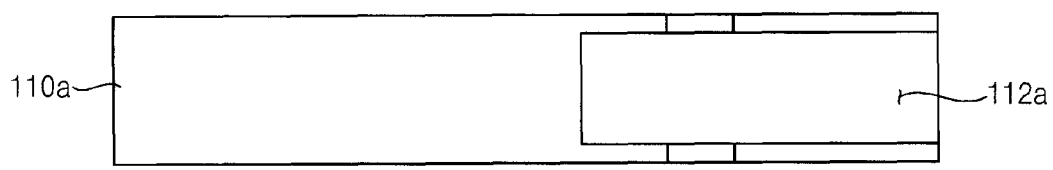
FIGS. 8 to 11 are cross-sectional views illustrating a method of manufacturing the semiconductor module of FIG. 7.

The PCB 110a may have the first surface 110-1 and the second surface 110-2 opposite to the first surface as illustrated in FIG. 8. Further, the PCB 110a may have an inner space 112a. The inner space 112a may be exposed to the outsides of the PCB through openings in the first surface 110-1 and the second surface 110-2 of the PCB 110, as illustrated in FIG. 8.

Referring back to FIG. 7, the first semiconductor package 120a and the second semiconductor package 122a may be received in the inner space 112a. Here, the first semiconductor package 120a and the second semiconductor package 122a may be substantially the same as the semiconductor package 120 of FIG. 2. A bonding pad of the first semiconductor package 120a may be exposed through the first surface of the PCB 110. A bonding pad of the second semiconductor package 122a may be exposed through the second surface of the PCB 110. That is, the bonding pad of the first semiconductor package 120a may be arranged and oriented toward an upward direction. In contrast, the bonding pad of the second semiconductor package 122a may be arranged and oriented toward a downward direction.

The first electrode pattern 132 may be formed on the first surface of the PCB 110. The first electrode pattern 132 may include a first electrode on the first surface of the PCB 110, and a second electrode over the bonding pad of the first semiconductor package 120a.

The second electrode pattern 134 may be formed on the second surface of the PCB 110. The second electrode pattern 134 may include a third electrode on the second surface of the PCB 110, and a fourth electrode under the bonding pad of the second semiconductor package 122a.

The first insulating layer pattern 142 may be formed on the first surface of the PCB 110 to cover the first electrode pattern 132. The first insulating layer pattern 142 may have the first opening 143 configured to expose the second electrode of the first electrode pattern 132 through the first insulating layer pattern 142. Thus, the bonding pad of the first semiconductor package 120a may be exposed through the inner space 112a and the first opening 143.

The second insulating layer pattern 144a may be formed on the second surface of the PCB 110 to cover the second electrode pattern 134. In this example embodiment, the second insulating layer pattern 144a may have a third opening 145a configured to expose the fourth electrode of the second electrode pattern 134 through the second insulating layer patter 144a. Thus, the bonding pad of the second semiconductor package 122a may be exposed through the inner space 112a and the third opening 145a.

The first outer terminal 150 may be mounted on the first insulating layer pattern 142. The first opening 143 and the inner space 112a may be filled with the first outer terminal 150. Therefore, the first outer terminal 150 may electrically connect the bonding pad of the first semiconductor package 120a to the second electrode of the first electrode pattern 132.

Additionally, a first dummy outer terminal 152 may be mounted on the first electrode of the first electrode pattern 132. In this example embodiment, the first insulating layer pattern 142 may have the second opening 148 configured to partially expose the first electrode of the first electrode pattern 132 through the first insulating layer pattern 142.

Further, various passive elements may be mounted on the first insulating layer pattern 142.

The second outer terminal 150a may be mounted on the second insulating layer pattern 144a. The third opening 145a and the inner space 112a may be filled with the second outer terminal 150a. Therefore, the second outer terminal 150a may electrically connect the bonding pad of the second semiconductor package 122a to the fourth electrode of the second electrode pattern 134.

Additionally, a second dummy outer terminal 152a may be mounted on the third electrode of the second electrode pattern 134. In this example embodiment, the second insulating layer pattern 144a may have a fourth opening 148a configured to partially expose the third electrode of the second electrode pattern 134 through the second insulating layer pattern 144a.

Further, various passive elements may be mounted on the second insulating layer pattern 144a.

FIGS. 8 to 11 are cross-sectional views illustrating a method of manufacturing the semiconductor module of FIG. 7.

Referring to FIGS. 3 and 8, the inner space 112a may be formed in the PCB 110a. The inner space 112a may be exposed through the first surface 110-1 and the second surface 10-2 of the PCB 110a.

Figure 9:
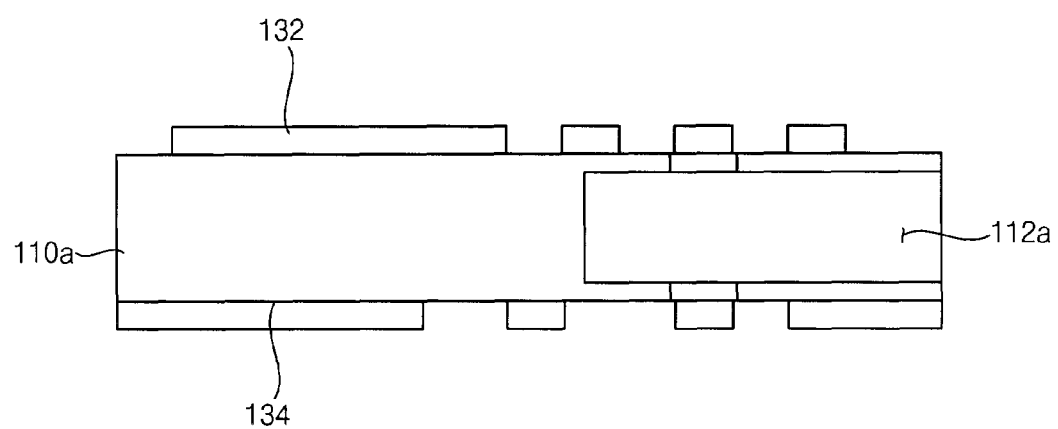

Referring to FIG. 9, the first electrode pattern 132 may be formed on the first surface of the PCB 110a. In this example embodiment, the second electrode of the first electrode pattern 132 may be located in an upper portion of the inner space 112a.

The second electrode pattern 134 may be formed on the second surface of the PCB 110. In this example embodiment, the fourth electrode of the second electrode pattern 134 may be located in a lower portion of the inner space 112a.

Figure 10:
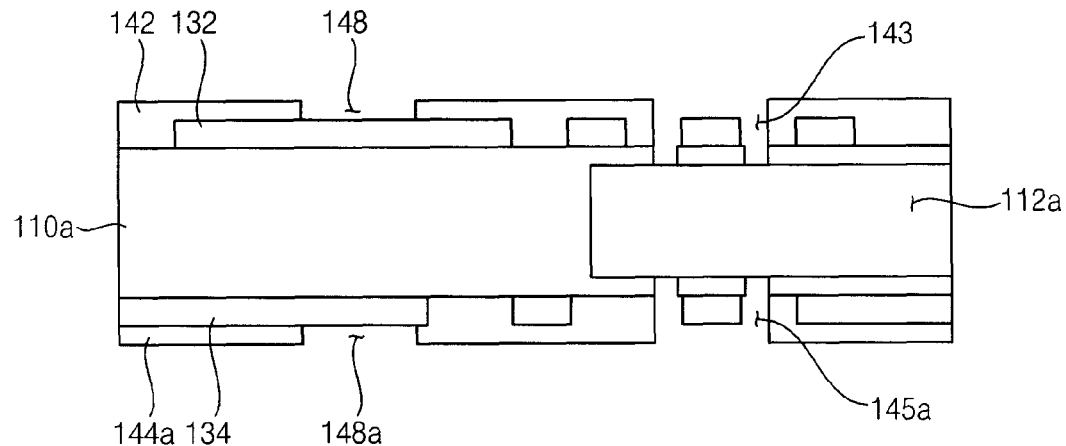

Referring to FIG. 10, the first insulating layer pattern 142 having the first opening 143 and the second opening 148 may be formed on the first surface of the PCB 110a and the first electrode pattern 132. Here, the first electrode of the first electrode pattern 132 may be exposed to an outside of the first insulating layer pattern 142 through the second opening 148. Further, the second electrode of the first electrode pattern 132 may be exposed to the outside of the first insulating layer pattern 142 through the first opening 143.

The second insulating layer pattern 144a having the third opening 145a and the fourth opening 148a may then be formed on the second surface of the PCB 110 and the second electrode pattern 134. In this example embodiment, the third electrode of the second electrode pattern 134 may be exposed through the fourth opening 148a. The fourth electrode of the second electrode pattern 134 may be exposed through the third opening 145a.

Figure 11:
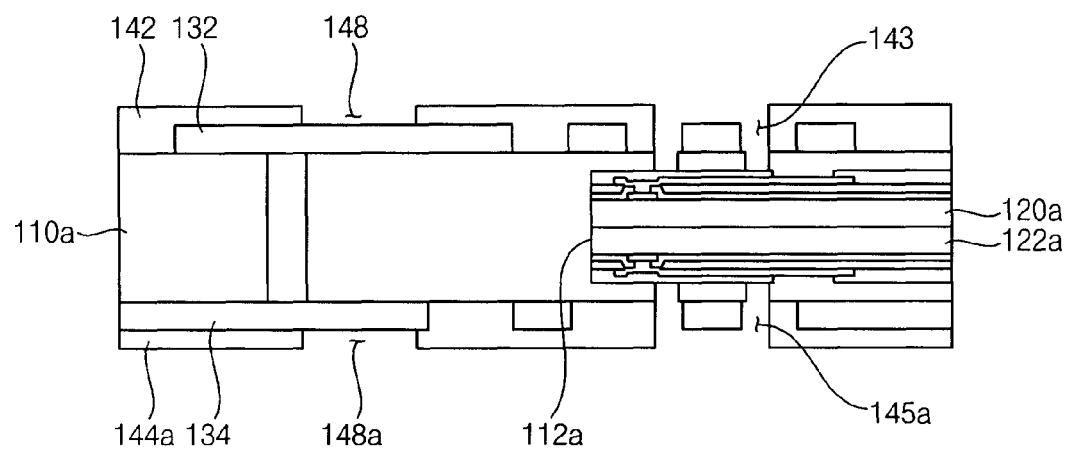

Referring to FIG. 11, the first semiconductor package 120a and the second semiconductor package 122a may be inserted into the inner space 112a. The bonding pad of the first semiconductor package 120a may be exposed through the inner space 112a and the first opening 143. The bonding pad of the second semiconductor package 122a may be exposed through the inner space 112a and the third opening 145a.

Referring to FIGS. 7 and 11, the first outer terminal 150 may be mounted on the first insulating layer pattern 142 to cover the first opening 143 and the inner space 112a. Thus, the second electrode of the first electrode pattern 132 may be electrically connected to the bonding pad of the first semiconductor package 120a via the first outer terminal 150.

The second outer terminal 150a may be mounted on the second insulating layer pattern 144a to cover the third opening 145a and the inner space 112a. Thus, the fourth electrode of the second electrode pattern 134 may be electrically connected to the bonding pad of the second semiconductor package 122a via the second outer terminal 150a.

Additionally, the first dummy outer terminal 152 may be mounted on the first insulating layer pattern 142 to cover the second opening 148. Further, the second dummy outer terminal 152a may be mounted on the second insulating layer pattern 144a to cover the fourth opening 148a. The first dummy outer terminal 152 may be electrically connected to the first electrode of the first electrode pattern 132. The second dummy outer terminal 152a may be electrically connected to the third electrode of the second electrode pattern 134.

Further, the first outer terminal 150, the second outer terminal 150a, the first dummy outer terminal 152 and the second dummy outer terminal 152a may be firmly attached to the first electrode pattern 132 and the second electrode pattern 134, respectively, by a reflow process.

According to some example embodiments, the semiconductor package may be received in the inner space of the PCB. Thus, the PCB may surround all of the outer surfaces of the semiconductor package so that cracks may not be generated in the outer terminals. Further, because a molding member may be unnecessary, it may be very easy to repair or exchange the outer terminal. Furthermore, the semiconductor package may not cause a thickening of the semiconductor module, so that the semiconductor module may have a very thin thickness.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor module comprising:
   a printed circuit board (PCB) having an inner space;
   a semiconductor package received in the inner space and electrically connected to the PCB;
   an electrode pattern formed on the PCB and electrically connected to the semiconductor package;
   an insulating layer pattern formed on the PCB in fluidic communication with the inner space, the insulating layer pattern having an opening to partially expose the electrode pattern through the insulating layer pattern; and
   an outer terminal mounted on the PCB to cover the inner space and the opening and to electrically connect the electrode pattern to the semiconductor package,
   wherein the semiconductor package comprises:
      a semiconductor chip having a bonding pad;
      a first insulating layer pattern formed on the semiconductor chip and configured to expose the bonding pad through the first insulating layer pattern;
      a conductive layer pattern formed on the first insulating layer pattern, the conductive layer pattern having a first end electrically connected to the bonding pad, and a second end opposite to the first end and electrically connected to the PCB through the inner space; and
      a second insulating layer pattern formed on the conductive layer pattern and the first insulating layer pattern, and configured to expose the second end of the conductive layer pattern through the second insulating layer pattern.

2. The semiconductor module of claim 1, further comprising a dummy outer terminal mounted on the PCB and electrically connected to the electrode pattern.

3. A semiconductor module comprising:
   a printed circuit board (PCB) having a first surface, a second surface opposite to the first surface and an inner space exposed through the first surface and the second surface;
   a first semiconductor package received in the inner space;
   a second semiconductor package received in the inner space;
   a first electrode pattern formed on the first surface of the PCB;
   a second electrode pattern formed on the second surface of the PCB;
   a first insulating layer pattern formed on the first surface of the PCB in fluidic communication with the inner space, the first insulating layer pattern having a first opening to partially expose the first electrode pattern through the first insulating layer pattern;
   a second insulating layer pattern formed on the second surface of the PCB in fluidic communication with the inner space, the second insulating layer pattern having a second opening to partially expose the second electrode pattern through the second insulating layer; a first outer terminal mounted on the first surface of the PCB to cover the inner space and the first opening and to electrically connect the first electrode pattern to the first semiconductor package; and
   a second outer terminal mounted on the second surface of the PCB to cover the inner space and the second opening and to electrically connect the second electrode pattern to the second semiconductor package.

4. The semiconductor module of claim 3, further comprising:
   a first dummy outer terminal mounted on the first surface of the PCB and electrically connected to the first electrode pattern; and
   a second dummy outer terminal mounted on the second surface of the PCB and electrically connected to the second electrode pattern.

* * * * *